(12) United States Patent
Papandreou et al.

(10) Patent No.: US 11,264,103 B2
(45) Date of Patent: *Mar. 1, 2022

(54) HYBRID READ VOLTAGE CALIBRATION IN NON-VOLATILE RANDOM ACCESS MEMORY

(71) Applicant: International Business Machines Corporation, Armonk, NY (US)

(72) Inventors: Nikolaos Papandreou, Thalwil (CH); Charalampos Pozidis, Thalwil (CH); Nikolas Ioannou, Zurich (CH); Roman Alexander Pletka, Uster (CH); Radu Ioan Stoica, Zurich (CH); Sasa Tomic, Kilchberg (CH); Timothy Fisher, Cypress, TX (US); Aaron Daniel Fry, Richmond, TX (US); Andrew D. Walls, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 303 days.

This patent is subject to a terminal disclaimer.

(21) Appl. No.: 16/554,371

(22) Filed: Aug. 28, 2019

(65) Prior Publication Data
US 2021/0065813 A1 Mar. 4, 2021

(51) Int. Cl.
*G11C 16/26* (2006.01)
*G11C 16/04* (2006.01)
(Continued)

(52) U.S. Cl.
CPC .......... *G11C 16/26* (2013.01); *G11C 11/5642* (2013.01); *G11C 11/5671* (2013.01);
(Continued)

(58) Field of Classification Search
CPC ...................................................... G11C 15/26
(Continued)

(56) References Cited

U.S. PATENT DOCUMENTS

| | | |
|---|---|---|
| 9,966,147 B1 | 5/2018 | Lien et al. |
| 10,140,040 B1 | 11/2018 | Koudele et al. |

(Continued)

FOREIGN PATENT DOCUMENTS

GB 2537484 A 10/2016

OTHER PUBLICATIONS

Wang et al., "Modeling of program Vth distribution for 3-D TLC NAND flash memory," Science China Information Sciences vol. 62, Research Paper, Apr. 2019, pp. 042401:1-042401:10.
(Continued)

*Primary Examiner* — Min Huang
(74) *Attorney, Agent, or Firm* — Zilka-Kotab, P.C.

(57) ABSTRACT

A computer-implemented method, according to one embodiment, includes: determining a current operating state of a block of memory. The block includes more than one type of page therein, and at least one read voltage is associated with each of the page types. The current operating state of the block is further used to produce a hybrid calibration scheme for the block which identifies a first subset of the read voltages, and a second subset of the read voltages. The read voltages in the second subset are further organized in one or more groupings. A unique read voltage offset value is calculated for each of the read voltages in the first subset, and a common read voltage offset value is also calculated for each grouping of read voltages in the second subset.

20 Claims, 11 Drawing Sheets

(51) Int. Cl.
    *G11C 11/56* (2006.01)
    *G11C 16/34* (2006.01)
(52) U.S. Cl.
    CPC ...... *G11C 16/0483* (2013.01); *G11C 16/3404* (2013.01); *G11C 16/349* (2013.01)
(58) Field of Classification Search
    USPC .................................................. 365/189.011
    See application file for complete search history.

(56) References Cited

U.S. PATENT DOCUMENTS

| | | | |
|---|---|---|---|
| 10,199,111 B1* | 2/2019 | Besinga | G11C 29/00 |
| 2016/0147582 A1* | 5/2016 | Karakulak | G06F 11/073 |
| | | | 714/37 |
| 2018/0033491 A1* | 2/2018 | Marelli | G06F 11/076 |
| 2018/0203642 A1* | 7/2018 | Sharma | G06F 3/0619 |
| 2019/0066739 A1 | 2/2019 | Muchherla et al. | |
| 2019/0066802 A1 | 2/2019 | Malshe et al. | |
| 2021/0134377 A1* | 5/2021 | Papandreou | G06F 11/076 |

OTHER PUBLICATIONS

IBM, "IBM FlashSystem A9000: Introduction," IBM, 4 pages, retrieved on Aug. 28, 2019 from https://www.ibm.com/support/knowledgecenter/en/STJKMM_12.2.1/fs_a9k_po_ch_introduction.html.
U.S. Appl. No. 16/109,689, filed Aug. 22, 2018.

* cited by examiner

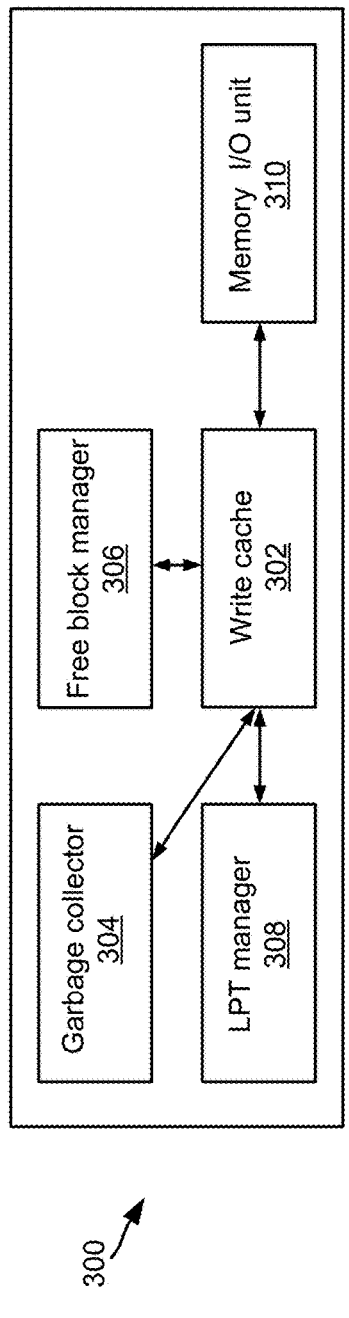
FIG. 3
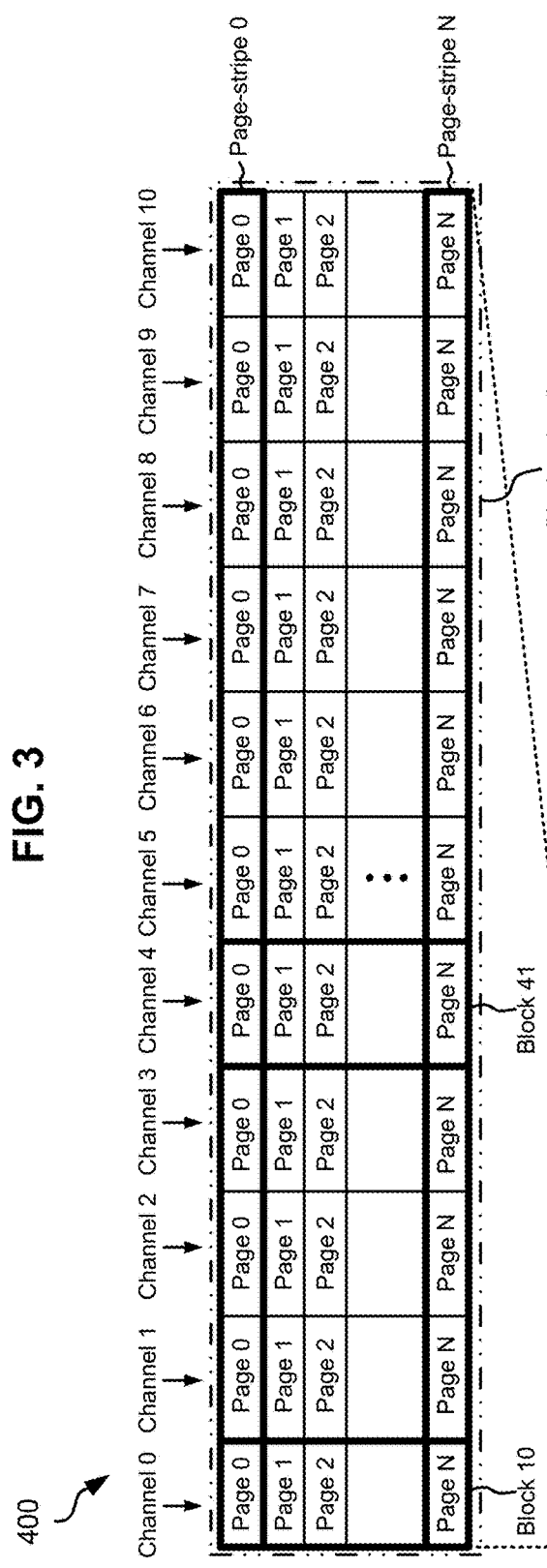
FIG. 4A
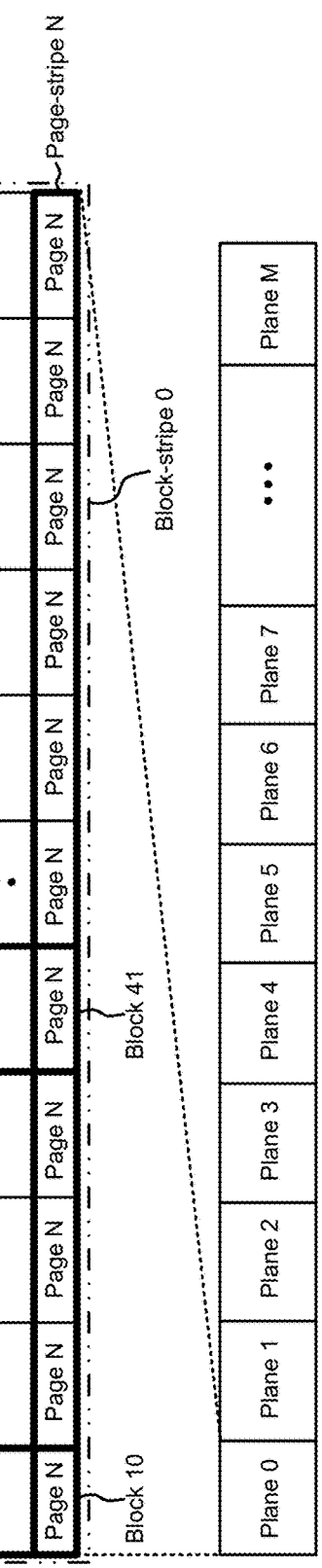

| previous configuration for voltage Vn, n=1:15 | new configuration for voltage Vn, n=1:15 | new offset for voltage Vn, n=1:15 |
|---|---|---|
| independent offset | independent offset | use previous offset value |
| independent offset | common offset in a group | calculate mean of offset values from all voltages in the group |
| common offset in a group | independent offset | use common offset value in previous group |
| common offset in a group | common offset in a group | calculate mean of offset values from all voltages in the group |

| read voltage offsets to keep in metadata per word-line | hybrid calibration scheme for generic states 802 | | hybrid calibration scheme for read disturb states 804 | | hybrid calibration scheme for retention states 806 | |
|---|---|---|---|---|---|---|
| | read voltage(s) | offset type | read voltages | offset type | read voltages | offset type |
| Δ1 | V1 | independent | V1 | independent | V1 | independent |
| Δ2 | V2 | independent | V2 | independent | V3, V5, V7, V9 | common |
| Δ3 | V3 | independent | V3 | independent | V4 | independent |
| Δ4 | V4, V12 | common | V4 | independent | V8 | independent |
| Δ5 | V5, V7, V9, V11 | common | V5 | independent | V2, V6, V10 | common |
| Δ6 | V6, V10 | common | V6, V10, V14 | common | V11 | independent |
| Δ7 | V8 | independent | V8 | independent | V12 | independent |
| Δ8 | V13 | independent | V12 | independent | V13 | independent |
| Δ9 | V14 | independent | V7, V9, V11, V13 | common | V14 | independent |
| Δ10 | V15 | independent | V15 | independent | V15 | independent |

FIG. 8

HYBRID READ VOLTAGE CALIBRATION IN NON-VOLATILE RANDOM ACCESS MEMORY

BACKGROUND

The present invention relates to data storage systems, and more particularly, this invention relates to calibrating the read voltages of blocks in non-volatile random access memory (NVRAM).

NVRAM is a type of random-access memory which retains information stored thereon even after the power supply is turned off, and includes a number of different forms. Using Flash memory as an example, the performance characteristics of conventional NAND Flash-based solid state drives (SSDs) are fundamentally different from those of traditional hard disk drives (HDDs). Data in conventional SSDs is typically organized in pages of 4, 8, or 16 KB sizes. Moreover, page read operations in SSDs are typically one order of magnitude faster than write operations and latency neither depends on the current nor the previous location of operations.

The raw bit error rate (RBER) of a Flash memory block will typically increase over time due to additional program/erase (P/E) cycling, charge leakage over time (i.e., data retention), and additional charge placed in the cells by read or program operations (i.e., read or program disturb errors, respectively). Typically, a Flash memory block is retired when any page in the block exhibits a code word that reaches a page retirement error count limit. This limit is typically set to be achieved in conjunction with an appropriate error correction code (ECC), resulting in the Uncorrectable Bit Error Rate (UBER) after applying the ECC for a Flash memory block being set to be similar to the UBER in traditional hard disk drives, e.g., at around $10^{-15}$, but may be more or less.

Block calibration, which refers to algorithms that adjust the read voltages, has been shown to significantly improve the RBER and therefore enhance endurance and retention, particularly for enterprise-level Flash memory systems using modern three-dimensional (3-D) triple-level-cell (TLC) or quad-level-cell (QLC) NAND Flash memory. Previous attempts to maintain efficient memory performance typically included inspecting the read voltages for each block of memory in a sweeping fashion or by a read voltage shifting algorithm that tracks and corrects the read voltages depending on how the threshold voltage distributions have changed as a result of cycling or retention or other disturbing effects.

SUMMARY

A computer-implemented method, according to one embodiment, is for calibrating read voltages for a block of memory. The computer-implemented method includes: determining a current operating state of a block of memory. The block includes more than one type of page therein, and at least one read voltage is associated with each of the page types. The current operating state of the block is further used to produce a hybrid calibration scheme for the block, where the hybrid calibration scheme identifies a first subset of the read voltages, as well as a second subset of the read voltages. The read voltages in the second subset are further organized in one or more groupings. A unique read voltage offset value is calculated for each of the read voltages in the first subset, and a common read voltage offset value is also calculated for each grouping of read voltages in the second subset. Each of the unique read voltage offset values and each of the common read voltage offset values are stored in a metadata storage area of the given block. Furthermore, the hybrid calibration scheme is saved in the metadata storage area of the given block.

A computer program product, according to another embodiment, is for calibrating read voltages for a block of memory. The computer program product includes a computer readable storage medium having program instructions embodied therewith. The program instructions are further readable and/or executable by a processor to cause the processor to: perform the foregoing method.

A system, according to yet another embodiment, includes: a processor, and logic integrated with and/or executable by the processor. The logic is configured to: perform the foregoing method.

Other aspects and embodiments of the present invention will become apparent from the following detailed description, which, when taken in conjunction with the drawings, illustrate by way of example the principles of the invention.

BRIEF DESCRIPTION OF THE DRAWINGS

FIG. 3 is a system diagram, in accordance with one embodiment.

FIG. 4A is a conceptual diagram which includes a block-stripe and page-stripe, in accordance with one embodiment.

FIG. 7 is a table which outlines an exemplary rule, in accordance with one embodiment.

FIG. 8 is a table which outlines predetermined hybrid calibration schemes, in accordance with an in-use example.

DETAILED DESCRIPTION

Figure 1:
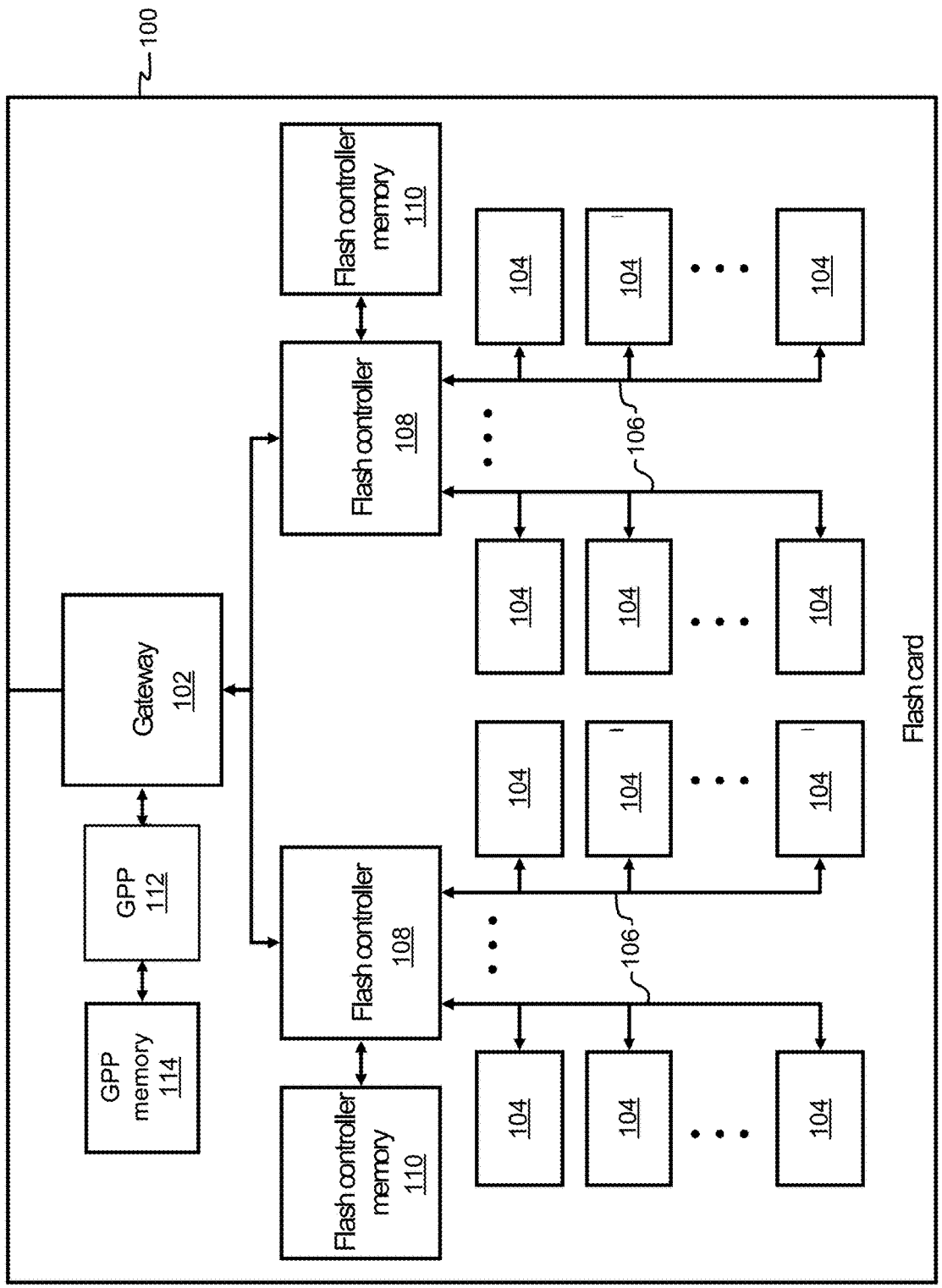
FIG. 1 is a diagram of a non-volatile memory card, in accordance with one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several preferred embodiments of data storage systems, as well as operation and/or component parts thereof. It should be appreciated that various embodiments herein can be implemented with a wide range of memory mediums, including for example NVRAM technologies such as NAND Flash memory, NOR Flash memory, phase-change memory (PCM), magnetoresistive RAM (MRAM) and resistive RAM (RRAM). To provide a context, and solely to assist the reader, various embodiments may be described with reference to a type of non-volatile memory. This has been done by way of example only, and should not be deemed limiting on the invention defined in the claims.

In one general embodiment, a computer-implemented method is for calibrating read voltages for a block of memory. The computer-implemented method includes: determining a current operating state of a block of memory. The block includes more than one type of page therein, and at least one read voltage is associated with each of the page types. The current operating state of the block is further used to produce a hybrid calibration scheme for the block, where the hybrid calibration scheme identifies a first subset of the read voltages, as well as a second subset of the read voltages. The read voltages in the second subset are further organized in one or more groupings. A unique read voltage offset value is calculated for each of the read voltages in the first subset, and a common read voltage offset value is also calculated for each grouping of read voltages in the second subset. Each of the unique read voltage offset values and each of the common read voltage offset values are stored in a metadata storage area of the given block. Furthermore, the hybrid calibration scheme is saved in the metadata storage area of the given block.

In another general embodiment, a computer program product is for calibrating read voltages for a block of memory. The computer program product includes a computer readable storage medium having program instructions embodied therewith. The program instructions are further readable and/or executable by a processor to cause the processor to: perform the foregoing method.

In yet another general embodiment, a system includes: a processor, and logic integrated with and/or executable by the processor. The logic is configured to: perform the foregoing method.

FIG. 1 illustrates a memory card 100, in accordance with one embodiment. It should be noted that although memory card 100 is depicted as an exemplary non-volatile data storage card in the present embodiment, various other types of non-volatile data storage cards may be used in a data storage system according to alternate embodiments. It follows that the architecture and/or components of memory card 100 are in no way intended to limit the invention, but rather have been presented as a non-limiting example.

Moreover, as an option, the present memory card 100 may be implemented in conjunction with features from any other embodiment listed herein, such as those described with reference to the other FIGS. However, such memory card 100 and others presented herein may be used in various applications and/or in permutations which may or may not be specifically described in the illustrative embodiments listed herein. Further, the memory card 100 presented herein may be used in any desired environment.

With continued reference to FIG. 1, memory card 100 includes a gateway 102, a general purpose processor (GPP) 112 (such as an ASIC, FPGA, CPU, etc.) connected to a GPP memory 114 (which may comprise RAM, ROM, battery-backed DRAM, phase-change memory PC-RAM, MRAM, STT-MRAM, etc., or a combination thereof), and a number of memory controllers 108, which include Flash controllers in the present example. Each memory controller 108 is connected to a plurality of NVRAM memory modules 104 (which may comprise NAND Flash or other non-volatile memory type(s) such as those listed above) via channels 106.

According to various embodiments, one or more of the controllers 108 may be or include one or more processors, and/or any logic for controlling any subsystem of the memory card 100. For example, the controllers 108 typically control the functions of NVRAM memory modules 104 such as, data writing, data recirculation, data reading, etc. The controllers 108 may operate using logic known in the art, as well as any logic disclosed herein, and thus may be considered as a processor for any of the descriptions of non-volatile memory included herein, in various embodiments.

Moreover, the controller 108 may be configured and/or programmable to perform or control some or all of the methodology presented herein. Thus, the controller 108 may be considered to be configured to perform various operations by way of logic programmed into one or more chips, modules, and/or blocks; software, firmware, and/or other instructions being available to one or more processors; etc., and combinations thereof.

Referring still to FIG. 1, each memory controller 108 is also connected to a controller memory 110 which preferably includes a cache which replicates a non-volatile memory structure according to the various embodiments described herein. However, depending on the desired embodiment, the controller memory 110 may be battery-backed DRAM, phase-change memory PC-RAM, MRAM, STT-MRAM, etc., or a combination thereof.

Figure 2:
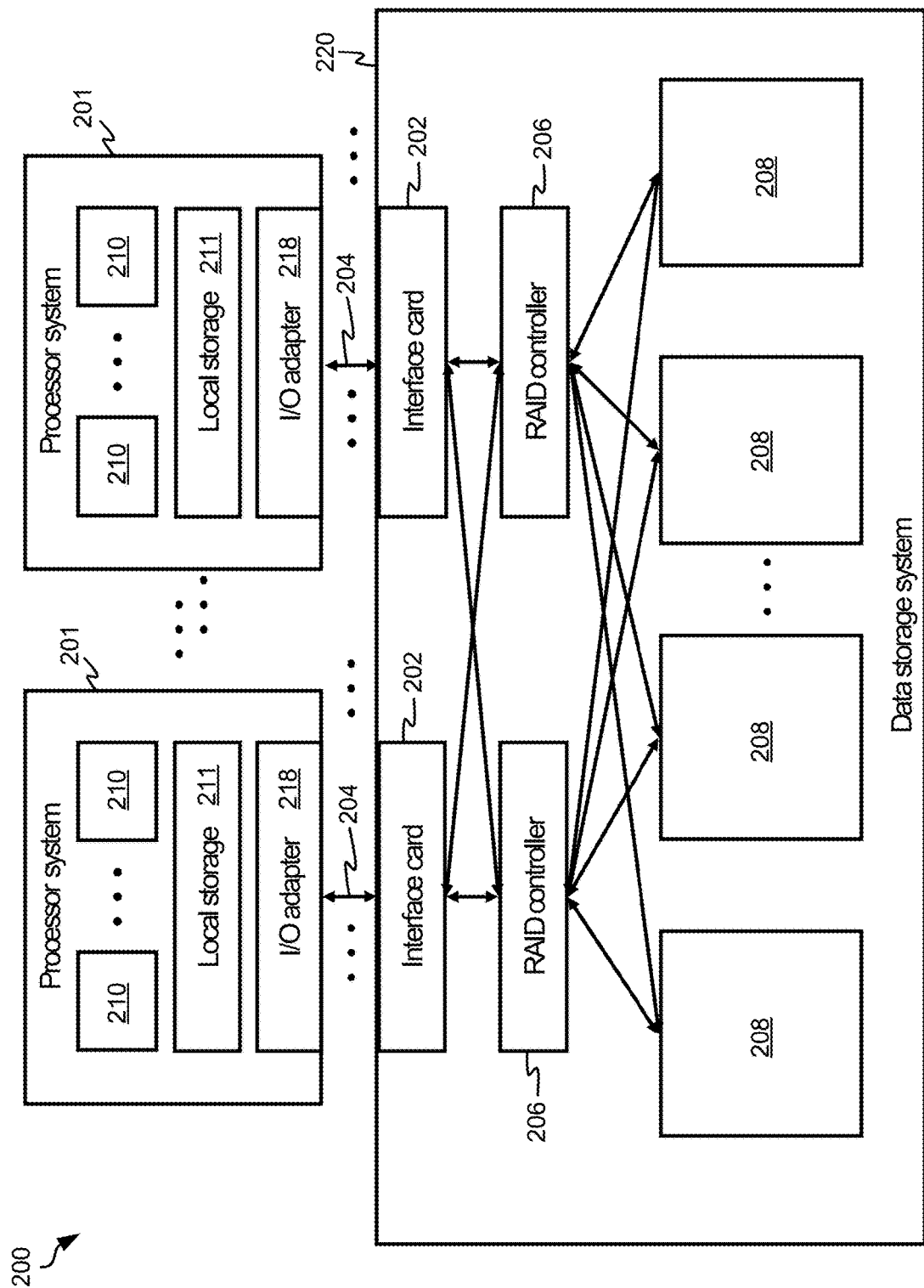
FIG. 2 is a diagram of a data storage system architecture, in accordance with one embodiment.

As previously mentioned, memory card 100 may be implemented in various types of data storage systems, depending on the desired embodiment. FIG. 2 illustrates a data storage system architecture 200 according to an exemplary embodiment which is in no way intended to limit the invention. Moreover, it should be noted that the data storage system 220 of FIG. 2 may include various components found in the embodiment of FIG. 1.

Looking to FIG. 2, the data storage system 220 comprises a number of interface cards 202 configured to communicate via I/O interconnections 204 to one or more processor systems 201. The data storage system 220 may also comprise one or more Redundant Array of Independent Disks (RAID) controllers 206 configured to control data storage in a plurality of non-volatile data storage cards 208. The non-volatile data storage cards 208 may comprise NVRAM, Flash memory cards, RAM, ROM, and/or some other known type of non-volatile memory.

The I/O interconnections 204 may include any known communication protocols, such as Fiber Channel (FC), FC over Ethernet (FCoE), Infiniband, Internet Small Computer System Interface (iSCSI), Transport Control Protocol/Internet Protocol (TCP/IP), Peripheral Component Interconnect Express (PCIe), etc., and/or any combination thereof.

The RAID controller(s) 206 in the data storage system 220 may perform a parity scheme similar to that employed by RAID-5, RAID-6, RAID-10, or some other suitable parity scheme, as would be understood by one of skill in the art upon reading the present descriptions.

Each processor system 201 comprises one or more processors 210 (such as CPUs, microprocessors, etc.), local data storage 211 (e.g., such as RAM 1014 of FIG. 10, ROM 1016 of FIG. 10, etc.), and an I/O adapter 218 configured to communicate with the data storage system 220.

Referring again to FIG. 1, memory controllers 108 and/or other controllers described herein (e.g., RAID controllers 206 of FIG. 2) may be able to perform various functions on stored data, depending on the desired embodiment. Specifically, memory controllers may include logic configured to perform any one or more of the following functions, which are in no way intended to be an exclusive list. In other words, depending on the desired embodiment, logic of a storage system may be configured to perform additional or alternative functions, as would be appreciated by one skilled in the art upon reading the present description.

Garbage Collection

Garbage collection in the context of SSD memory controllers of the present description may include the process of identifying blocks of data to be reclaimed for future usage and relocating all pages that are still valid therein. Moreover, depending on the specific controller and/or the respective garbage collection unit of operation, logical erase blocks (LEBs) may be identified for being reclaimed and/or relocated. Typically, one LEB corresponds to one block stripe, but alternative implementations may consider a fixed number of block stripes building a LEB as well.

A physical "block" represents a minimal unit that may be erased on non-volatile memory, e.g., such as NAND Flash memory, and thereby prepared for writing data thereto. However, a typical garbage collection unit of operation is often a multiple of the physical blocks of non-volatile memory, and is also referred to herein as a LEB. This is due to the fact that typically RAID-like parity information is added in LEBs. Therefore, in case of a page or block failure data can only be rebuilt when all blocks in the LEB are still holding data. Accordingly, the individual blocks from the garbage collection unit can only be erased either individually or in a single unit once all still valid data from all blocks in the LEB has been relocated successfully to new locations. Hence, the full garbage collection units are garbage-collected as a single unit. Moreover, the size of the LEB directly affects the garbage collection induced write amplification. The larger the LEB, the more likely it becomes that unrelated data are stored together in the LEB, and therefore more of the LEB data may have to be relocated upon garbage collection selection.

Frequently, blocks from different dies and/or Flash channels are grouped together, such that blocks from the same group can be read or written in parallel, thereby increasing overall bandwidth. It is also possible to combine the previous two methods, and to compose RAID stripes using blocks from different Flash channels that can be accessed in parallel.

It should also be noted that an LEB may include any multiple of the physical memory block, which is a unit of physical erasure. Moreover, the organization of memory blocks into LEBs not only allows for adding RAID-like parity protection schemes among memory blocks from different memory chips, memory planes and/or channels but also allows for significantly enhancing performance through higher parallelism. For instance, multiple non-volatile memory blocks may be grouped together in a RAID stripe. As will be appreciated by one skilled in the art upon reading the present description, RAID schemes generally improve reliability and reduce the probability of data loss.

According to an exemplary embodiment, which is in no way intended to limit the invention, memory controllers (e.g., see 108 of FIG. 1) may internally perform a garbage collection. As previously mentioned, the garbage collection may include selecting a LEB to be relocated, after which all data that is still valid on the selected LEB may be relocated (e.g., moved). After the still valid data has been relocated, the LEB may be erased and thereafter, used for storing new data. The amount of data relocated from the garbage collected LEB determines the write amplification. Moreover, an efficient way to reduce the write amplification includes implementing heat segregation.

Heat Segregation

In the present context, the "write heat" of data refers to the rate (e.g., frequency) at which the data is updated (e.g., rewritten with new data). Memory blocks that are considered "hot" tend to have a frequent updated rate, while memory blocks that are considered "cold" have an update rate slower than hot blocks.

Tracking the write heat of a logical page may involve, for instance, allocating a certain number of bits in the logical to physical table (LPT) mapping entry for the page to keep track of how many write operations the page has seen in a certain time period or window. Typically, host write operations increase the write heat whereas internal relocation writes decrease the write heat. The actual increments and/or decrements to the write heat may be deterministic or probabilistic.

Similarly, read heat may be tracked with a certain number of additional bits in the LPT for each logical page. To reduce meta-data, read heat can also be tracked at a physical block level where separate counters per block for straddling and non-straddling reads can be maintained. However, it should be noted that the number of read requests to and/or read operations performed on a memory block may not come into play for heat segregation when determining the heat of the memory block for some embodiments. For example, if data is frequently read from a particular memory block, the high read frequency does not necessarily mean that memory block will also have a high update rate. Rather, a high frequency of read operations performed on a given memory block may denote an importance, value, etc. of the data stored in the memory block.

By grouping memory blocks of the same and/or similar write heat values, write heat segregation may be achieved. In particular, write heat segregating methods may group write hot memory pages together in certain memory blocks while write cold memory pages are grouped together in separate memory blocks. Thus, a write heat segregated LEB tends to be occupied by either write hot or cold data.

The merit of write heat segregation is two-fold. First, performing a garbage collection process on a write hot memory block will prevent triggering the relocation of write cold data as well. In the absence of heat segregation, updates to write hot data, which are performed frequently, also results in the undesirable relocations of all write cold data collocated on the same LEB as the hot data being relocated. Therefore, the write amplification incurred by performing garbage collection is much lower for embodiments implementing write heat segregation.

Secondly, the relative write heat of data can be utilized for wear leveling purposes. For example, write hot data may be placed in healthier (e.g., younger) memory blocks, while write cold data may be placed on less healthy (e.g., older) memory blocks relative to those healthier memory blocks. Thus, the rate at which relatively older blocks are exposed to wear is effectively slowed, thereby improving the overall endurance of a given data storage system implementing write heat segregation.

Write Allocation

Write allocation includes placing data of write operations into free locations of open LEBs. As soon as all pages in a LEB have been written, the LEB is closed and placed in a pool holding occupied LEBs. Typically, LEBs in the occupied pool become eligible for garbage collection. The number of open LEBs is normally limited and any LEB being closed may be replaced, either immediately or after some delay, with a fresh LEB that is being opened.

During performance, garbage collection may take place concurrently with user write operations. For example, as a user (e.g., a host) writes data to a device, the device controller may continuously perform garbage collection on LEBs with invalid data to make space for the new incoming data pages. As mentioned above, the LEBs having the garbage collection being performed thereon will often have some pages that are still valid at the time of the garbage collection operation; thus, these pages are preferably relocated (e.g., written) to a new LEB.

Again, the foregoing functions are in no way intended to limit the capabilities of any of the storage systems described and/or suggested herein. Rather, the aforementioned functions are presented by way of example, and depending on the desired embodiment, logic of a storage system may be configured to perform additional or alternative functions, as would be appreciated by one skilled in the art upon reading the present description.

Referring now to FIG. 3, a system 300 is illustrated in accordance with one embodiment. As an option, the present system 300 may be implemented in conjunction with features from any other embodiment listed herein, such as those described with reference to the other FIGS. However, such system 300 and others presented herein may be used in various applications and/or in permutations which may or may not be specifically described in the illustrative embodiments listed herein. Further, the system 300 presented herein may be used in any desired environment, e.g., in combination with a controller.

As illustrated, system 300 includes a write cache 302 which is coupled to several other components, including garbage collector 304. As previously mentioned, garbage collector 304 may be used to free LEB units by relocating valid data and providing non-volatile memory blocks to be erased for later reuse. Thus, the garbage collector 304 may reclaim blocks of consecutive physical space, depending on the desired embodiment. According to an exemplary embodiment, block erase units may be used to keep track of and/or complete the erase of non-volatile memory blocks handed over by the garbage collector 304.

Write cache 302 is also coupled to free block manager 306 which may keep track of free non-volatile memory blocks after they have been erased. Moreover, as would be appreciated by one of ordinary skill in the art upon reading the present description, the free block manager 306 may build free stripes of non-volatile memory blocks from different lanes (e.g., block-stripes) using the erased free non-volatile memory blocks.

Referring still to FIG. 3, write cache 302 is coupled to LPT manager 308 and memory I/O unit 310. The LPT manager 308 maintains the logical-to-physical mappings of logical addresses to physical pages of memory. According to an example, which is in no way intended to limit the invention, the LPT manager 308 may maintain the logical-to-physical mappings of 4 KiB logical addresses. The memory I/O unit 310 communicates with the memory chips in order to perform low level operations, e.g., such as reading one or more non-volatile memory pages, writing a non-volatile memory page, erasing a non-volatile memory block, etc.

To better understand the distinction between block-stripes and page-stripes as used herein, FIG. 4A is a conceptual diagram 400, in accordance with one embodiment. LEBs are built from block stripes and typically a single block stripe is used to build a LEB. However, alternative embodiments may use multiple block stripes to form an LEB. As an option, the present conceptual diagram 400 may be implemented in conjunction with features from any other embodiment listed herein, such as those described with reference to the other FIGS. However, such conceptual diagram 400 and others presented herein may be used in various applications and/or in permutations which may or may not be specifically described in the illustrative embodiments listed herein. Further, the controller conceptual diagram 400 presented herein may be used in any desired environment. Thus, the exemplary non-volatile memory controller conceptual diagram 400 of FIG. 4A may be implemented in a cache architecture. However, depending on the desired embodiment, the conceptual diagram 400 of FIG. 4A may be implemented in defining the organization of data stored in non-volatile memory. Accordingly, both implementations are described in turn below.

Non-Volatile Memory

Looking now to FIG. 4A, the conceptual diagram 400 includes a set of M+1 aggregated planes labeled "Plane 0" through "Plane M". An aggregated plane consists of all physical planes with the same plane index on different channels. It should be noted that aggregated planes are also referred to herein simply as planes.

When implemented with data stored in non-volatile memory, each physical plane on a channel may include a large set of blocks, e.g., typically in the order of 1024, 2048 or more. Moreover, one or more physical planes may also include several additional blocks which may be used as replacement blocks for bad blocks (e.g., blocks performing poorly, blocks having undesirable characteristics, etc.).

In each plane of non-volatile memory, a single block from each channel forms a respective block-stripe. It follows that a number of block-stripes supported by a given embodiment of non-volatile memory may be determined by the number of blocks per plane and the number of planes.

In the exploded view of Plane 0, the conceptual diagram 400 further illustrates a single block-stripe (Block-stripe 0) out of the set of block-stripes supported in the remainder of the planes. Block-stripe 0 of plane 0 is shown as including 11 blocks, one block from each channel labeled "Channel 0" through "Channel 10". It should be noted that the association of blocks to block-stripe can change over time as block-stripes are typically dissolved after they have been garbage collected. Erased blocks may be placed in free block pools, whereby new block-stripes are assembled from blocks in the free block pools when write allocation requests fresh block-stripes. For example, looking to conceptual diagram 400, Block 10 from Channel 0 and Block 41 from Channel 4 are currently associated with the illustrated Block-stripe 0 of Plane 0. Furthermore, the illustrated Block-stripe 0 holds N+1 page-stripes and each block therefore holds N+1 pages labeled "Page 0" through "Page N".

Cache Architecture

Referring still to FIG. 4A, each block of pages illustrated in the exploded view of aggregated Plane 0 may constitute a unique block from one channel when implemented in a cache architecture. Similarly, each channel contributes a single, individual block which form a block-stripe. For example, looking to conceptual diagram 400, Block 10 from Channel 0 includes all pages (Page 0 through Page N) therein, while Block 41 from Channel 4 corresponds to all pages therein, and so on.

In the context of a memory controller, e.g., which may be capable of implementing RAID at the channel level, a block-stripe is made up of multiple blocks which amount to a stripe of blocks. Looking still to FIG. 4A, the multiple blocks of aggregated Plane 0 constitute Block-stripe 0. While all blocks in a block-stripe typically belong to the same aggregated plane, in some embodiments one or more blocks of a block-stripe may belong to different physical planes. It follows that each aggregated plane may include one or more block-stripe. Thus, according to an illustrative embodiment, Block 0 through Block 10 from different physical planes may constitute a block-stripe.

Regardless of whether the conceptual diagram 400 of FIG. 4A is implemented with non-volatile memory and/or a cache architecture, in different embodiments, the number of pages in each block and/or the number of channels in each plane may vary depending on the desired embodiment. According to an exemplary embodiment, which is in no way intended to limit the invention, a block may include 1024 pages, but could include more or less in various embodiments. Analogously, the number of channels per plane and/or the number of planes may vary depending on the desired embodiment.

Referring still to FIG. 4A, all pages in a block-stripe with the same page index denote a page-stripe. For example, Page-stripe 0 includes the first page (Page 0) of each channel in Block-stripe 0 of Plane 0. Similarly, Page-stripe N includes the last page (Page N) of each channel in Block-stripe 0 of Plane 0.

Figure 4B:
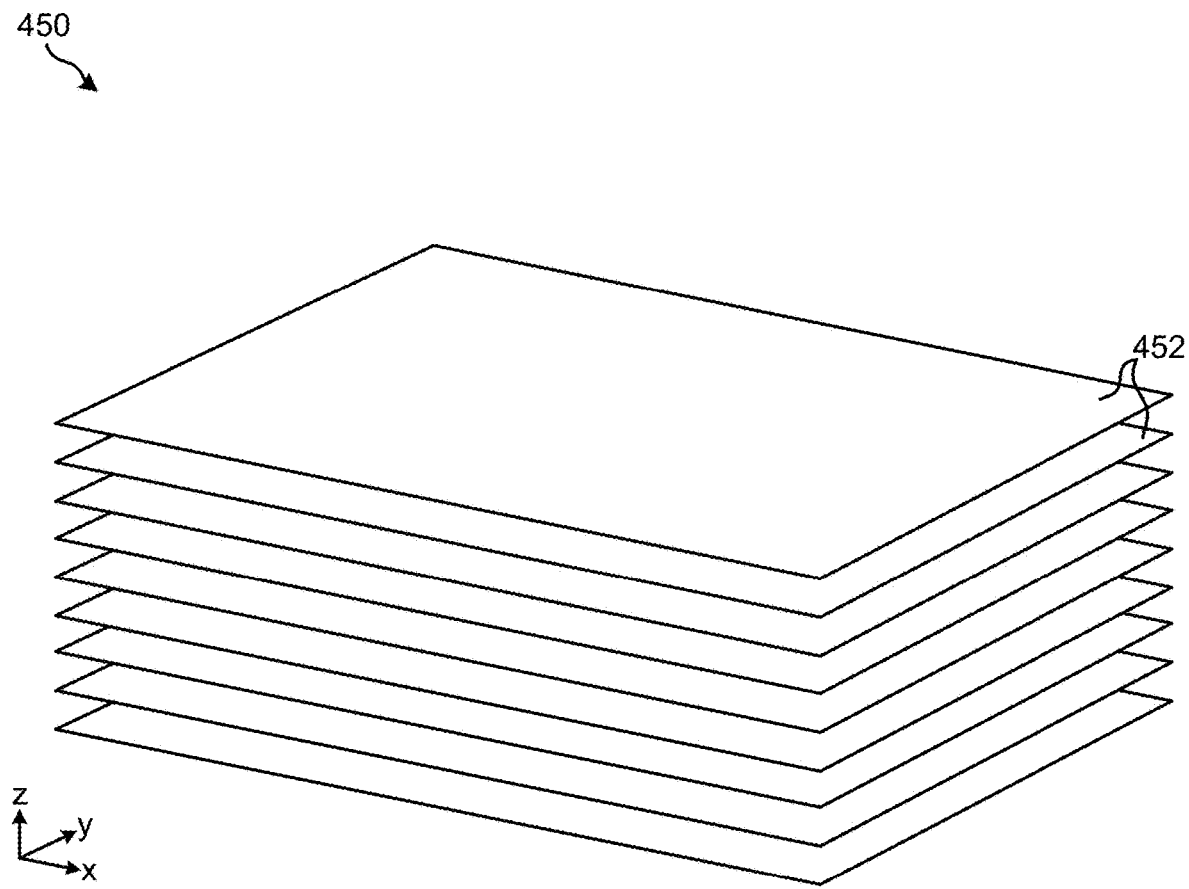
FIG. 4B is a partial perspective view of a 3-D non-volatile memory structure, in accordance with one embodiment.

The general storage architecture illustrated in the conceptual diagram 400 of FIG. 4A is also implemented by using 3-D memory structures in some approaches. For instance, FIG. 4B depicts a representational view of a 3-D non-volatile memory structure 450, in accordance with one embodiment. As an option, the present structure 450 may be implemented in conjunction with features from any other embodiment listed herein, such as those described with reference to the other FIGS., such as FIG. 4A. However, such structure 450 and others presented herein may be used in various applications and/or in permutations which may or may not be specifically described in the illustrative embodiments listed herein. Further, the structure 450 presented herein may be used in any desired environment. Thus FIG. 4B (and the other FIGS.) may be deemed to include any possible permutation.

As shown, each layer 452 of the 3-D non-volatile memory structure 450 extends along both the x-axis and the y-axis. Each of these layers 452 include a plurality of storage components (not shown), such as voltage supply lines, sensor stacks, transistors, etc., which are used to implement the non-volatile memory devices of the general storage architecture illustrated in the conceptual diagram 400 of FIG. 4A, e.g., as would be appreciated by one skilled in the art after reading the present description. Moreover, the various layers 452 are arranged in a stacked fashion along the z-axis in order to increase storage density and efficiency. Cells from different bitlines along a wordline (typically in the x or y dimension of FIG. 4B) are logically combined to form pages: In TLC, each wordline in a block contains 3 physical pages (e.g., a lower page, an upper page, and an extra page) and a wordline typically belongs to one particular layer in the z dimension (perpendicular to the x-y plane). For a particular block, which is formed from a grid of cells connected by wordlines and bitlines, the number of wordlines residing on the same layer is typically small. Therefore, a block can be formed from wordlines of all layers 452. Moreover, wordlines as well as pages in the same block may reside on different layers 452.

Again, due to cycling, retention, read disturb, program disturb, etc., or other mechanisms that may be specific to the 3-D NAND Flash technology (e.g., floating gate based or charge trap based technology), process technology, cell and material design, circuit and array architecture, etc., or other specific design factors, the programmed threshold voltage distributions in the memory block may change with writing and erasing data (cycling), reading data (read disturb), time (retention), etc., in a slow or fast manner. In other words, the RBER of Flash memory blocks increases with time and use. As memory blocks are used, each P/E cycle performed on the blocks causes damage of the memory cells, which in turn increases the corresponding RBER.

Block calibration is an important aspect of enhancing endurance and retention for Flash storage systems, e.g., particularly enterprise-level Flash systems, by reducing the RBER experienced. This block calibration corresponds to the read voltages and refers to algorithms that are able to track the changes of the threshold voltage distributions and adjust the read voltages accordingly, thereby significantly reducing the bit errors and improving the performance consistency in the respective device by reducing read tail latency which would otherwise result from error recovery mechanism invocations.

Moreover, adjustments to the read voltages are applied during a read command accordingly. It follows that the threshold voltage represents the voltage required to turn on the transistor of a given Flash memory cell and its value depends on the amount of charge stored during programming. However, the read voltage is a bias voltage, the value of which is typically between the threshold voltage of two adjacent logical states, e.g., as is explained in further detail below in FIG. 5.

Figure 5:
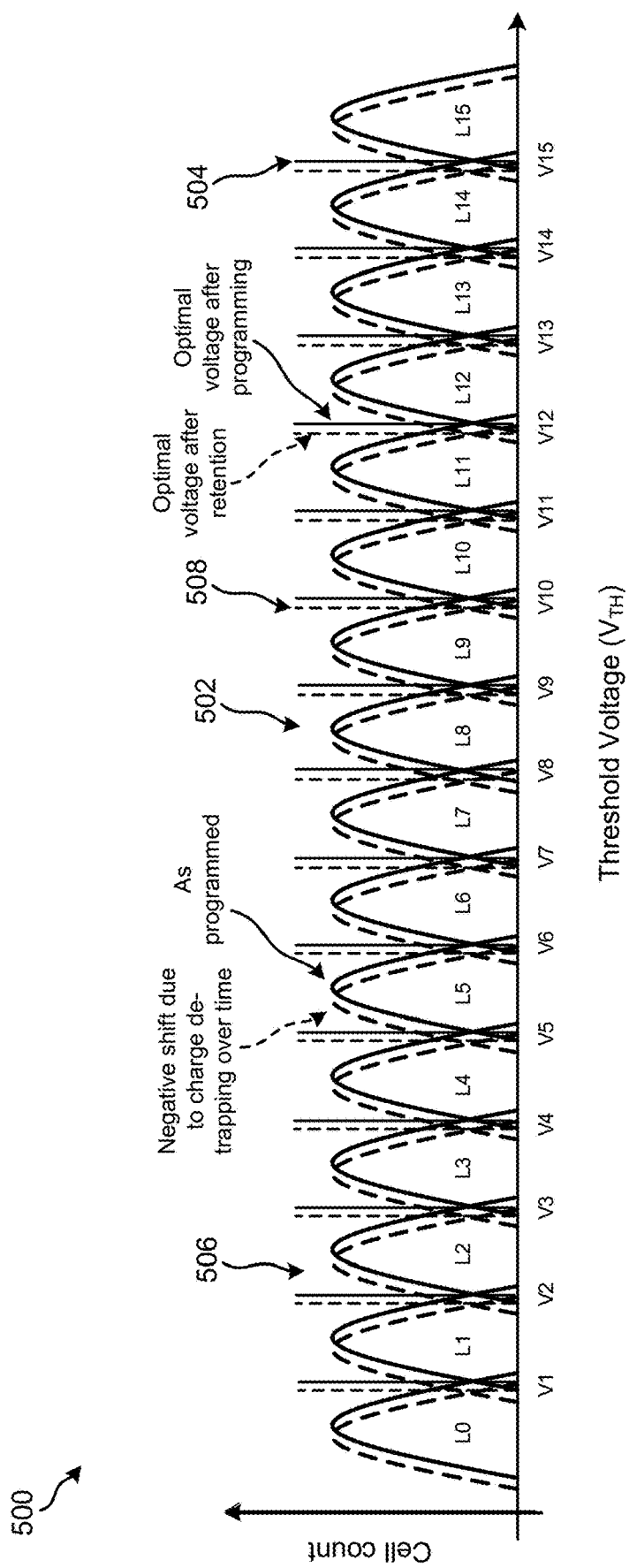
FIG. 5 is a graph which illustrates the threshold voltage shifting phenomenon, in accordance with one embodiment.

Referring momentarily to FIG. 5, a graph 500 illustrating the threshold voltage shifting phenomenon is illustrated in accordance with an example. The x-axis of the graph 500 represents the programmed threshold voltage $V_{TH}$, while the y-axis represents the corresponding cell count of a QLC NAND Flash memory block. In QLC NAND Flash memory, each memory cell stores 4 bits of information, therefore, the $V_{TH}$ distributions correspond to 16 possible discrete levels (L0, L1, . . . , L15). Moreover, each different type of page in a given block of QLC NAND Flash has a different set of the read voltages which correspond thereto. According to an example, which is in no way intended to limit the invention, a lower page corresponds to the V8 read voltage, an upper page corresponds to the V4 and V12 read voltages, an extra page corresponds to the V2, V6, V10, and V14 read voltages, while a top page corresponds to the V1, V3, V5, V7, V9, V11, V13 and V15 read voltages.

The solid distributions 502 indicate the $V_{TH}$ levels after programming. The vertical solid lines 504 indicate the read voltages (V1, . . . , V15) that are optimal for the $V_{TH}$ distributions 502. The dashed distributions 506 indicate a negative shift of the $V_{TH}$ levels due to charge loss over time. Because of this negative shift to lower voltages, the read voltages 504 are no longer optimal. Indeed, a negative offset must be applied to the read voltages in order to account for the changes of the $V_{TH}$ distributions from 502 to 506. The vertical dashed lines 508 indicate the read voltages (V1, ..., V15) that are optimal during retention for the $V_{TH}$ distributions in 506. In general, each of the 16 levels (L0, L1, ..., L15) shown in the figure may have a different $V_{TH}$ shift and thus, each of the 15 read voltages (V1, ..., V15) may have a different optimal shift.

Accordingly, the read voltage shift values (or offset values) are preferably determined shortly after a block has been written to and/or periodically thereafter. The threshold voltage can be considered an index of the cell programmed level (i.e., L0, L1, ..., L15), as determined by measuring the source-drain current when a control gate bias is applied to the memory cell. Typically, upon a read operation, one or more read voltages between adjacent nominal threshold voltage levels are used to determine the memory cell state. As the threshold voltage value of the memory cell changes (as explained above), the read voltages applied during a read operation are preferably shifted accordingly using a set of offset values to obtain optimal readout conditions and minimize the RBER. Subsequently, the optimal read voltage shift values may be updated periodically, e.g., in a background health check, or on demand, e.g., in the event of high bit error count or ECC failure.

Although increases to RBERs are irreparable for some blocks (e.g., such as those caused by prolonged P/E cycles), increases to RBERs caused by events such as retention and/or read disturbances are transient in the sense that the blocks which are affected are not irreversibly damaged. This unfavorable increase in RBERs is remedied when the corresponding memory blocks recalibrated such that the corresponding read voltages are corrected. In other approaches, blocks experiencing transient RBER increases may be remedied by being erased, programmed, and recalibrated. It is therefore apparent that the RBER of the block depends on the state of the block, which may be determined by the cycling state, the retention state, the read disturb state and/or any combinations thereof. Block recalibration improves the RBER by adjusting the read voltages so that they are optimal under the various changes of the $V_{TH}$ distributions under permanent effects and/or transient effects.

Ideally, the read voltages for each page in a block of memory are updated individually. However, as the storage capacity of memory increases, the amount of storage consumed by maintaining a read voltage offset value for each page in each block of memory increases as well. For instance, going from 3 bits per cell in TLC NAND Flash memory to 4 bits per cell in QLC NAND Flash memory, each block implements 16 threshold voltage levels (instead of 8 in TLC), and 15 different read voltages (instead of 7 in TLC) to read any of the pages included therein. Moreover, with the improvements in vertical stacking and process technology, the number of layers in every new generation of 3-D NAND Flash increases as well. Subsequently, the number of pages in each block also increases. For example, current 3-D QLC NAND Flash memory may have more than 90 layers and each block may have more than 4000 pages. Thus, if all of these 15 different read voltages in 3-D QLC NAND are calibrated independently (or individually), the amount of metadata involved with storing an individual set of read offset values for each page, or group of pages, in a block and the number of calibration reads per page increases significantly.

Moreover, the different pages in a block may exhibit different read offset values mainly attributed to process variations that result in the various cells having differences in their threshold voltage characteristics. One approach to reduce the amount of metadata may be to group pages of the same type, e.g., lower pages or upper pages, and to use a set of read voltage offsets for all members of the same group. A second approach to reduce the amount of metadata may be to use a single offset value for all read voltages that are used when reading a specific page type, e.g., to shift all four read voltages V2, V6, V10 and V14 in tandem by a best common offset for the example of extra pages described above. Such an approach reduces the amount of metadata stored for each extra page, or group of extra pages, in the block from 4 values to 1 value and also reduces the number of calibration reads accordingly.

However, in order for this second approach to be effective, the change of the threshold voltage levels (which are discriminated by the applications of the specific read voltages) is preferably uniform and towards the same direction. For example, all $V_{TH}$ levels shift to negative values. However, this assumption may not hold under all different states that a block may experience. For example, read disturb stress tends to generate a positive shift to the left-most $V_{TH}$ levels, while retention tends to generate a negative shift that is higher in the right-most $V_{TH}$ levels. Moreover, in modern TLC and QLC NAND Flash memories, where the margin between the adjacent $V_{TH}$ levels is small, a common offset applied to multiple read voltages may not be sufficient to reduce the RBER whereas individual offsets for all or for selected read voltages may be implemented.

It follows that various ones of the embodiments included herein implement a hybrid calibration method, in which select read voltages in a block are calibrated independently and the remaining read voltages are grouped together based on the corresponding page type, and are calibrated according to a best common offset that is applied to all read voltages in the group. For example, the read voltages which correspond to the left-most and right-most $V_{TH}$ levels, e.g., levels L0, L1, L2, L3 and L12, L13, L14, L15 in FIG. 5, may be more sensitive to various sources of disturbance or noise (e.g., such as retention and/or read disturb) than those read voltages located towards the middle. For instance, it may be appreciated by those skilled in the art that the left-most and right-most $V_{TH}$ levels in a block may experience a more pronounced shift which also diverges along different directions when the device is subjected to retention and read disturb stress compared to the shift of the middle $V_{TH}$ levels. As a consequence, it becomes apparent that the corresponding left-most and right-most read voltages may benefit from individual calibration, while the middle read voltages may form one or more voltage groupings and each voltage grouping may be calibrated by using a common best offset without compromising the RBER. Thus, some of the embodiments herein benefit by performing individual voltage calibrations for the read voltages which correspond to the outermost $V_{TH}$ levels, while applying common voltage calibrations for the read voltages which correspond to the middle $V_{TH}$ levels. This desirably offers improved RBERs while also keeping the metadata size relatively low, e.g., as will be described in further detail below.

Figure 6:
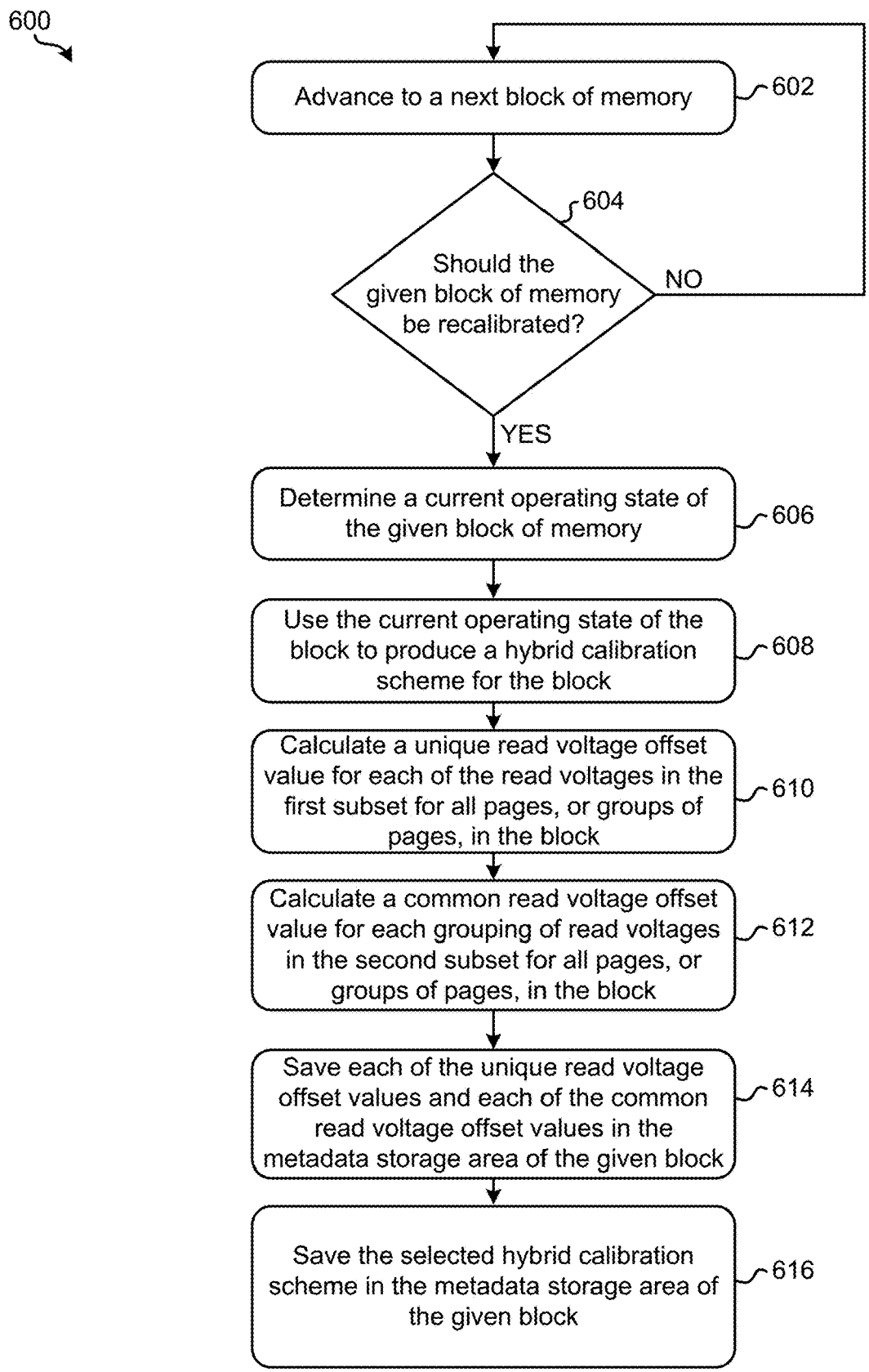
FIG. 6 is a flowchart of a method, in accordance with one embodiment.

Referring now to FIG. 6, a flowchart of a method 600 for selecting a hybrid calibration scheme for the read voltages of a block of memory is illustrated in accordance with one embodiment. The method 600 may be performed in accordance with the present invention in any of the environments depicted in FIGS. 1-5, among others, in various embodiments. For instance, any of the processes included in method 600 may be performed with respect to blocks of storage space in 3-D TLC NAND Flash, 3-D QLC NAND Flash, etc., or any other desired type of memory. Furthermore, more or less operations than those specifically described in FIG. 6 may be included in method 600, as would be understood by one of skill in the art upon reading the present descriptions.

Each of the steps of the method 600 may be performed by any suitable component of the operating environment. For example, in various embodiments, the method 600 may be partially or entirely performed by a controller (e.g., Flash controller), a processor, a computer, etc., or some other device having one or more processors therein. Thus, in some embodiments, method 600 may be a computer-implemented method. It should also be noted that the terms computer, processor and controller may be used interchangeably with regards to any of the embodiments herein, such components being considered equivalents in the many various permutations of the present invention.

Moreover, for those embodiments having a processor, the processor, e.g., processing circuit(s), chip(s), and/or module(s) implemented in hardware and/or software, and preferably having at least one hardware component may be utilized in any device to perform one or more steps of the method 600. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 6, operation 602 of method 600 includes advancing to a next block of memory. With respect to the present description, "a next block of memory" may vary depending on the given approach. For instance, upon initiating method 600, a next block of memory may simply be a first block of memory. In other approaches, a next block of memory may be a next logical block of memory. Moreover, operation 602 may progress between the blocks of memory in any desired manner, e.g., sequentially, randomly, using a pattern, etc. Moreover, operation 602 may be triggered periodically, e.g., every 1 week, by a background process that examines all the NAND blocks, or may be triggered on demand, e.g., in the event of a page read in a block exhibiting a high bit error count or an ECC failure. Moreover, the memory preferably includes NVRAM. For instance, in some approaches the memory includes 3-D TLC NAND Flash, while in other approaches the memory includes 3-D QLC NAND Flash.

Decision 604 further includes determining whether the given block of memory should be recalibrated. In some approaches, criteria may be implemented which identify when and if a particular block should be recalibrated. For example, a block may be recalibrated after experiencing a predetermined number of P/E cycles (e.g., 500P/E cycles), experiencing an undesirably low performance metric (e.g., the number of bit errors exhibiting a predetermined error count threshold), a predetermined amount of time has passed since a last recalibration, etc. This allows for some reduction in the amount of computing overhead experienced, e.g., as would be appreciated by one skilled in the art after reading the present description.

In response to determining that the given block of memory should not be recalibrated for whatever reason, method 600 returns to operation 602 whereby a next block is advanced to before repeating decision 604. However, in response to determining that the given block of memory should be recalibrated, method 600 proceeds to operation 606. There, operation 606 includes determining a current operating state of the given block of memory. This operating state may be determined based on various types of available information. For example, block statistics including a P/E cycling counter value, a read-disturb counter value, a retention timer, an open/close block state, a number of programmed pages in the block, etc. may be used to determine the current operating state of the block. It should also be noted that the block includes more than one type of page therein (e.g., upper page, lower page, extra page, top page), and at least one read voltage is associated with each of the page types, e.g., as would be appreciated by one skilled in the art after reading the present description.

An illustrative list of current operating states a given block of memory may be experiencing includes, but is in no way limited to, a retention state, a read-disturb state, a cycling state, an open and/or closed state (e.g., if part or all of the pages in the block have been programmed), etc., and/or any combination thereof. Each of the operating states a block may be experiencing may be utilized to identify which of the read voltages would benefit most from an individual recalibration, and which read voltages may be grouped together and be recalibrated using a common offset value. In other words, the operating state of a block may give insight into how the $V_{TH}$ levels have changed, or may be expected to change, and thus how the corresponding read voltages should be adjusted to account for those $V_{TH}$ changes. The more critical read voltages may thereby be given additional attention during the recalibration process in an effort to improve the overall RBER by applying individual offset recalibration, while the read voltages that can be grouped together are recalibrated by a common offset in an effort to reduce metadata and improve performance.

For example, it may be determined that the left-most read voltages in a block experiencing a read-disturb state would benefit most from (e.g., are more critical for) individual recalibration. This can be explained by the fact that read-disturb stress mainly affects the left-most $V_{TH}$ levels along the read voltage distribution (e.g., as seen in FIG. 5), while the middle and right-most $V_{TH}$ levels may experience a moderate or a low disturbance. Accordingly, the read voltages corresponding to the left-most $V_{TH}$ levels are preferably recalibrated independently, while at least some of the remaining read voltages are recalibrated together as a group, e.g., by applying a best fit common read voltage offset value. According to another example, it may be determined that the right-most read voltages in a block experiencing a retention state are more critical for individual recalibration. This can be explained by the fact that during retention the negative shift is more pronounced for the right-most $V_{TH}$ levels while the middle and left-most $V_{TH}$ levels may experience a moderate or a low negative shift. Accordingly, the read voltages corresponding to the right-most $V_{TH}$ levels are preferably calibrated independently, while at least some of the remaining read voltages are recalibrated together as group, e.g., by applying a best common offset value.

It follows that a hybrid calibration scheme preferably identifies a first and second subset of the read voltages which correspond to the different types of pages in a given block. The read voltages are preferably separated such that those in the first subset are more critical according to the operating state of the block and therefore warrant individual recalibration, while the read voltages in the second subset include those read voltages which are less critical (e.g., at least in comparison to the read voltages included in the first subset) and can be recalibrated using a common offset. Read voltages that are included in the second subset are preferably further organized in one or more read voltage groupings. For example, read voltages in the second subset which are used for reading pages of the same type (e.g., lower pages, upper pages, extra pages, top pages, etc.) are preferably grouped together to form read voltage groupings. Accordingly, a same read voltage offset value may be applied to each of the read voltages included in a same read voltage grouping, e.g., as will soon become apparent.

Recalibrating two or more read voltages together typically produces a common read voltage offset value which is applied to each of the two or more read voltages. However, depending on the operating state of the block, these two or more read voltages may be less critical to read errors and thus a common read voltage offset value may therefore be a good approximation of the desired read voltage offset value for each of these read voltages. Thus, the recalibration scheme is able to reduce the total amount of metadata stored in memory for each block and the total amount of read operations that are performed during recalibration without compromising the overall RBER. It follows that by pairing a given block with a current operating state, operation 606 is able to determine valuable information about how the $V_{TH}$ levels therein have changed or at least are expected to change. Given this information, the current operating state provides insight into which of the read voltages would benefit most from experiencing individual read voltage recalibration and which of the read voltages can be grouped together and recalibrated using a common read voltage offset value.

Proceeding to operation 608, the current operating state of the block is used to produce a hybrid calibration scheme for the block. In other words, the current operating state of a block is used to identify and/or compute a hybrid calibration scheme which may be applied to the block to recalibrate the pages included therein. As mentioned above, a hybrid calibration scheme preferably identifies a first subset of read voltages in a block which are more critical and therefore would more greatly benefit from experiencing individual recalibration, in addition to a second subset of read voltages in the block which can be grouped together and recalibrated by a common read voltage offset value. The read voltages identified in the first subset may thereby be recalibrated individually to reduce the chance of experiencing read errors, while the read voltages identified in the second subset are recalibrated together by using a common offset to reduce the amount of metadata that is stored for each block of memory and also to reduce the number of calibration reads.

In an attempt to reduce the overall calibration metadata overhead, the number of unique read voltage offset values that may be stored for the pages in a word-line, or group of word-lines, may be less than the total number of read voltages that the NAND chip uses, i.e., 15 read voltages for QLC NAND Flash memory. For instance, if "K" represents the number of unique read voltage offset values that may be stored for the pages in a word-line, or group of word-lines, and "N" represents the total number of read voltages, then K<N. According to an example, which is in no way intended to limit the invention, N=15 and K=10. Such a constraint is considered when the hybrid calibration scheme is selected or computed in 608. In one example that is in no way intended to be limiting, a total of K=10 read voltage offset values may be stored in metadata storage for the pages of a word-line, or group of word-lines, in a block. In this example, a hybrid calibration scheme may determine that from the N=15 read voltages V1, V2, . . . , V15 as seen in FIG. 5, 7 specific read voltages (e.g., V1, V2, V3, V8, V13, V14 and V15) are preferably calibrated individually, while the remaining read voltages are used to form 3 different read voltage groupings depending on the different page types that these remaining voltages are used for. For instance, V4 and V12 form a first read voltage grouping, V6 and V10 form a second read voltage grouping, and V5, V7, V9 and V11 form a third read voltage grouping. Moreover, each of these read voltage grouping is calibrated by a common offset value.

The decision on which read voltages are to be recalibrated independently and which are to be grouped and be recalibrated by a common read voltage offset value may be static in some approaches, while in other approaches the decision is made dynamically. In other words, in some approaches the hybrid calibration schemes are predetermined (e.g., based on lab measurements) and stored in memory (e.g., in a lookup table). It follows that each of the predetermined hybrid calibration schemes may be correlated with a current operating state. Accordingly, the process of producing a hybrid calibration scheme for the block may simply involve matching the current operating state of the block with a corresponding one of a number of predetermined hybrid calibration schemes for the block.

However, in other approaches the hybrid calibration schemes are dynamically produced based on performance information that is available. For instance, using the current operating state of the block to produce a hybrid calibration scheme for a block in some approaches includes computing the hybrid calibration scheme for the block using available statistics associated with the current operating state of the block. An illustrative list of statistics associated with the current operating state of the block that may be used to compute a hybrid calibration scheme includes, but is not limited to, a P/E counter, a read disturb counter, a retention timer, a retention metric, a cycling level, read disturb system counters, etc., or any other type of statistics which are available and/or which would be apparent to one skilled in the art after reading the present description.

Given a selected configuration, an algorithm, often called read-level shifting algorithm, may be implemented to calculate the read voltage offset values. According to some approaches, the read-level shifting algorithm may be an iterative algorithm that finds a desired offset value by searching the available space towards the direction of increasing or decreasing values that reduces the error count and selecting the offset value that minimizes the error count. According to other approaches, the read-level shifting algorithm may be an extensive search algorithm that searches all or a subset of the available offset values.

With continued reference to FIG. 6, method 600 proceeds to operation 610 which includes calculating a unique read voltage offset value for each of the read voltages in the first subset. As mentioned above, the first subset of the read voltages is identified based on the hybrid voltage calibration scheme produced in 608. Moreover, a read-level shifting algorithm may be employed. As mentioned above, the read voltages included in the first subset are those identified as being more susceptible to producing read errors. Moreover, each of the read voltages in the first subset correspond to a page type. Further, as mentioned previously, one approach to reduce the calibration metadata may be to group pages (of the same page type) with similar RBER characteristics in the same group and use the same set of read voltage offset values for all pages in the group. Therefore, operation 610 is repeated for all pages, or group of pages, in the block, i.e., a unique read voltage offset value for each of the read voltages in the first subset is calculated for each page, or group of pages, in the block depending on the page type of the page, or the group of pages.

Moreover, operation 612 includes calculating a common read voltage offset value for each grouping of read voltages in the second subset. As mentioned above, the read voltages identified in the second subset include those read voltages identified as being less susceptible to producing read errors.

Moreover, each of the read voltages organized in a given read voltage grouping corresponds to a same page type. Therefore, the read voltages identified in the second subset and which are included in a same read voltage grouping (e.g., which correspond to a same page type) are recalibrated together to reduce the amount of metadata that is stored for each block of memory. Moreover, a read-level shifting algorithm may be employed.

Operation 612 is repeated for all pages, or group of pages, in the block, i.e., a common read voltage offset value for each of the read voltage groupings in the second subset is calculated for each page, or group of pages, in the block depending on the page type of the page, or the group of pages.t should also be noted that the process of calculating a unique read voltage offset value for a given read voltage may be performed using any processes which would be apparent to one skilled in the art after reading the present description.

As previously mentioned, the read voltages which are included in the same grouping preferably correspond to the same type of page. In other words, all read voltages in a given read voltage group may correspond to pages which are of the same type, e.g., upper page type. For example, each of the read voltages included in a first read voltage grouping correspond to lower pages, while each of the read voltages included in a second read voltage grouping correspond to upper pages, each of the read voltages included in a third read voltage grouping correspond to extra pages, and each of the read voltages included in a fourth read voltage grouping correspond to top pages. It follows that calculating a common read voltage offset value for each read voltage grouping in the second subset may involve calculating a read voltage offset value for each of the read voltages, and determining a mean value, a median value, a weighted average, etc. for the given read voltage grouping, or may involve searching through a number of read voltage offset values and determining which offset value results in the minimum number of errors when applied as a common offset to all the read voltages in the same voltage grouping.

As noted herein, a read-level shifting algorithm that aims to adjust the read voltages is based on an iterative procedure that examines a number of candidate offsets and selects the one that minimizes the number of read errors. The candidate offsets may be fixed (e.g., predetermined), calculated dynamically based on different information (e.g. current and/or next positive or negative offsets), based on an algorithm such as line-search, etc. It follows that for any read voltage, or group of read voltages, a read-level shifting algorithm will use the most recent value that was calculated and stored for the particular block in the previous calibration round as a starting offset value.

For instance, when a hybrid calibration scheme is employed, the initial read voltage offset values for the level-shifting algorithm are preferably configured properly. For instance, assume a new group of voltages is defined for a given page, or group of pages, in a block, where some of the voltages are previous members of the group and some voltages that were previously calibrated independently are new members of the group. Here, the new group includes voltages that have a different offset based on the previous calibration round. Accordingly, a new common read voltage offset value is preferably determined as a common current offset for the new voltage grouping.

Looking to FIG. 7, a table 700 which presents an exemplary rule which may be applied to each group of read voltages is illustrated in accordance with one embodiment which is in no way intended to limit the invention. As an option, the present rule defined in table 700 may be implemented in conjunction with features from any other embodiment listed herein, such as those described with reference to the other FIGS., such as FIG. 6. However, such rule in table 700 and others presented herein may be used in various applications and/or in permutations which may or may not be specifically described in the illustrative embodiments listed herein. Further, the rule in table 700 presented herein may be used in any desired environment.

As shown, each read voltage Vn for n=1:15 of a new configuration inherits a read voltage offset value from a previous configuration. Thus, if the read voltage was previously calibrated individually, it inherits the previous unique read voltage offset value, whereas if the read voltage was previously included in a read voltage group, it inherits the previous common read voltage offset value of the group. This inherited read voltage offset value is used to calculate the new starting read voltage offset value for the level-shifting algorithm depending on the new configuration. The table 700 further identifies that if a given read voltage was previously calibrated individually and is also calibrated individually according to the new configuration, the new read voltage offset value remains the same as the previous read voltage offset value. However, if a given read voltage was previously calibrated individually and in the new configuration is included in a read voltage grouping, an average of the read voltage offset values for the read voltages in the same grouping formed in the new configuration is calculated and applied.

Furthermore, if a given read voltage was previously included in a read voltage grouping, but is now calibrated individually in the new configuration, the previous common read voltage offset value for the voltages in the same grouping of the previous configuration is maintained. However, if a given read voltage was previously included in a read voltage grouping, and is now included in a new read voltage grouping in the new configuration, an average of the read voltage offset values for the voltages in the new page grouping is calculated and applied.

Referring back to FIG. 6, operation 614 includes saving (e.g., storing) each of the unique read voltage offset values and each of the common read voltage offset values in the metadata storage area of the given block. Moreover, operation 616 includes saving (e.g., storing) the hybrid calibration scheme produced in operation 608 in the metadata storage area of the given block. The saved configuration of the hybrid calibration scheme may be an identifier from a list of hybrid calibration schemes or any identifier that encodes information about which of the read voltages are calibrated independently and which are forming voltage groupings and calibrated with a common offset.

The information saved in the metadata storage area during operations 614 and 616 is used when the memory controller needs to access any of the pages in a given block. For example, the controller may need to access an extra page that may further belong to a group of extra pages in a given block. Before accessing the given extra page, the memory controller retrieves from the metadata storage area of the given block the set of read voltage offset values corresponding to the given group of extra pages according to the latest calibration round. In addition, the controller retrieves from the metadata storage area the hybrid configuration scheme of the given block. Based on the hybrid configuration scheme and the set of read voltage offset values, the controller sends the respective commands to change the settings of read voltage values used for reading a page of extra page type in the NAND Flash chip. The new settings of read voltage values correspond to the desired values according to the current operating state of the given block, thus maximizing the probability for the controller to perform a read access with a low RBER. After sending the above mentioned commands, the controller sends the respective commands to read the given extra page.

It follows that various ones of the embodiments included herein are able to achieve efficient processes of selecting a hybrid calibration scheme for the read voltages for blocks of memory (e.g., NAND Flash memory). Some of these embodiments store more than one bit per cell based on a hybrid scheme that identifies which of the multiple read voltages will be calibrated by receiving a single individual offset and which voltages will be grouped together and be calibrated by a single common offset. This distinction between individual offsets and common offsets is based on the state of the block to be calibrated in preferred approaches, e.g., a retention state, a read disturb state, a cycling state, etc. Moreover, the voltages that are grouped together into one or more voltage groupings correspond to the same type of pages, i.e., lower pages, upper pages, extra pages, top pages, etc.

Referring now to FIG. 8 an example of a number of different predetermined hybrid calibration schemes organized in a table 800. It follows that the table 800 may be implemented in conjunction with features from any other embodiment listed herein, such as those described with reference to the other FIGS., such as FIG. 6. For instance, each of the predetermined hybrid calibration schemes in the table 800 may correspond to a particular current block operating state and be implemented as desired.

However, such table 800 and others presented herein may be used in various applications and/or in permutations which may or may not be specifically described in the illustrative embodiments listed herein. Further, the table 800 presented herein may be used in any desired environment. Thus FIG. 8 (and the other FIGS.) may be deemed to include any possible permutation.

As shown, the table 800 includes three different predetermined hybrid calibration schemes 802, 804, 806, each of which correspond to a different block operating state. Table 800 refers to a QLC NAND Flash memory with N=15 read voltages (i.e., V1, . . . , V15). Each of the different predetermined hybrid calibration schemes 802, 804, 806 also involve storing K=10 (K<N) different read voltage offset values (i.e., Δ1, . . . , Δ10) in metadata for each word-line, or group of word-lines, in a given block. Some of these read voltage offset values correspond to an independent calibration type as noted in the "offset type" column by a "independent" indicator, while other ones of the read voltage offset values correspond to voltage grouping and calibration by a common offset value as noted in the "offset type" column by a "common" indicator. The read voltages that are grouped and calibrated by a common read offset value are shown in the column "read voltages".

Here, the first predetermined hybrid calibration schemes 802 corresponds to a generic block operating state in that it may be applied to circumstances which generally involve cycling, retention and read disturb states. Another of the predetermined hybrid calibration schemes 804 corresponds to a read disturb block operating state in that it may be applied to blocks which are currently experiencing read disturb states of higher stress. Furthermore, another of the predetermined hybrid calibration schemes 806 corresponds to a retention block operating state in that it may be applied to blocks which are currently experiencing retention states of longer duration. The predetermined hybrid calibration schemes outlined in table 800 may be stored in memory (e.g., in a lookup table) and applied to blocks based on their current operating state according to any of the approaches described herein.

It should also be noted that none of the particular configurations included in any of the approaches included herein are intended to be limiting. For instance, the number and/or type of pages included in a given block of memory, the number and/or values of the read voltages, the number and/or values of the threshold voltage levels, etc. included in any of the approaches included herein are in no way intended to be limiting, but rather have been presented by way of example only.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. The processor may be of any configuration as described herein, such as a discrete processor or a processing circuit that includes many components such as processing hardware, memory, I/O interfaces, etc. By integrated with, what is meant is that the processor has logic embedded therewith as hardware logic, such as an application specific integrated circuit (ASIC), a FPGA, etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

Figure 9:
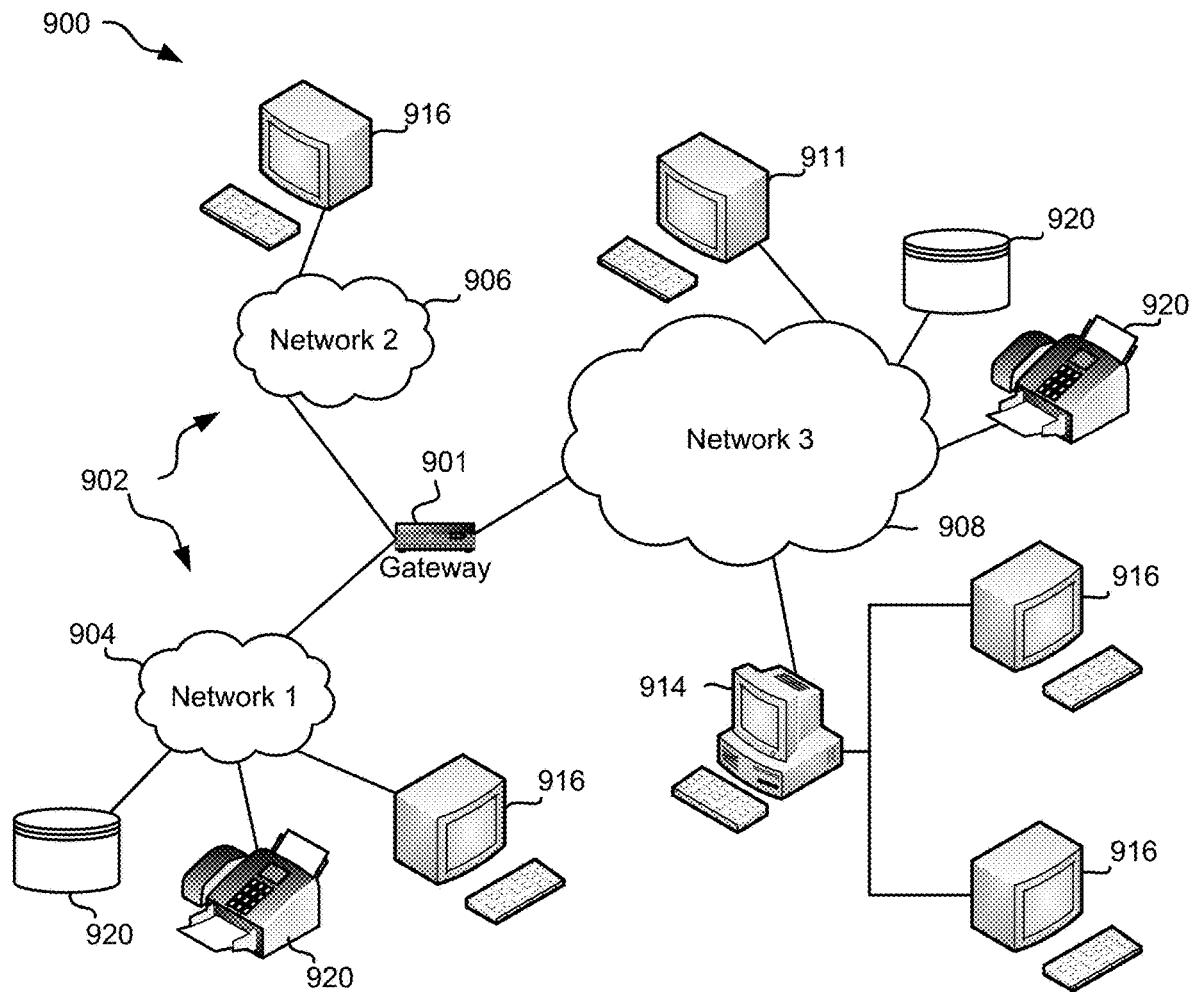
FIG. 9 is a network architecture, in accordance with one embodiment.

FIG. 9 illustrates a network architecture 900, in accordance with one embodiment. As shown in FIG. 9, a plurality of remote networks 902 are provided including a first remote network 904 and a second remote network 906. A gateway 901 may be coupled between the remote networks 902 and a proximate network 908. In the context of the present network architecture 900, the networks 904, 906 may each take any form including, but not limited to a LAN, a WAN such as the Internet, public switched telephone network (PSTN), internal telephone network, etc.

In use, the gateway 901 serves as an entrance point from the remote networks 902 to the proximate network 908. As such, the gateway 901 may function as a router, which is capable of directing a given packet of data that arrives at the gateway 901, and a switch, which furnishes the actual path in and out of the gateway 901 for a given packet.

Further included is at least one data server 914 coupled to the proximate network 908, and which is accessible from the remote networks 902 via the gateway 901. It should be noted that the data server(s) 914 may include any type of computing device/groupware. Coupled to each data server 914 is a plurality of user devices 916. Such user devices 916 may include a desktop computer, laptop computer, handheld computer, printer, and/or any other type of logic-containing device. It should be noted that a user device 911 may also be directly coupled to any of the networks, in some embodiments.

A peripheral 920 or series of peripherals 920, e.g., facsimile machines, printers, scanners, hard disk drives, networked and/or local data storage units or systems, etc., may be coupled to one or more of the networks 904, 906, 908. It should be noted that databases and/or additional components may be utilized with, or integrated into, any type of network element coupled to the networks 904, 906, 908. In the context of the present description, a network element may refer to any component of a network.

According to some embodiments, methods and systems described herein may be implemented with and/or on virtual systems and/or systems which emulate one or more other systems, such as a UNIX system which virtually hosts a MICROSOFT WINDOWS environment, etc. This virtualization and/or emulation may be enhanced through the use of VMWARE software, in some embodiments.

In other embodiments, one or more networks 904, 906, 908, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used, as known in the art.

Figure 10:
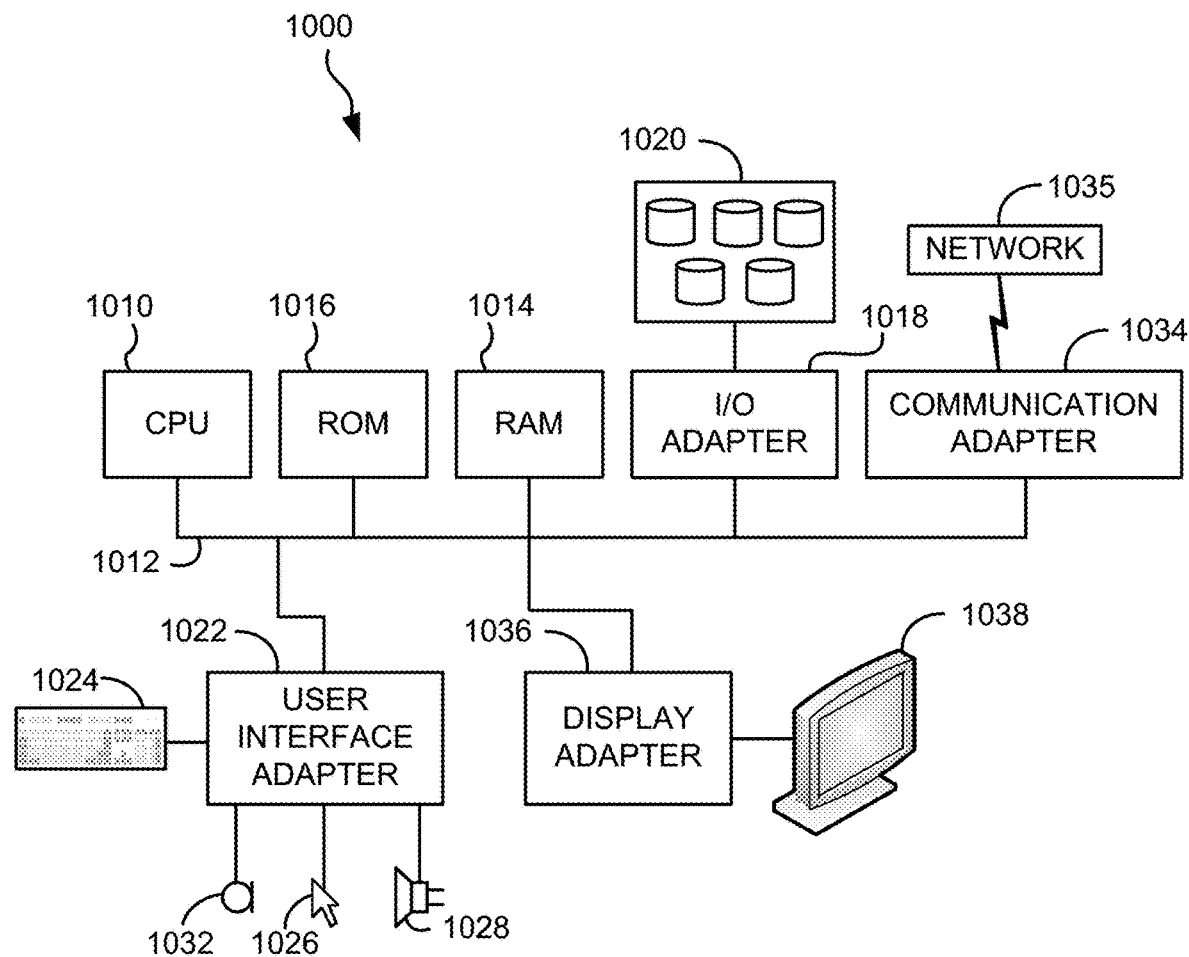
FIG. 10 is a representative hardware environment that may be associated with the servers and/or clients of FIG. 9, in accordance with one embodiment.

FIG. 10 shows a representative hardware environment associated with a user device 916 and/or server 914 of FIG. 9, in accordance with one embodiment. FIG. 10 illustrates a typical hardware configuration of a processor system 1000 having a central processing unit 1010, such as a microprocessor, and a number of other units interconnected via a system bus 1012, according to one embodiment. In some embodiments, central processing unit 1010 may include any of the approaches described above with reference to the one or more processors 210 of FIG. 2.

The processor system 1000 shown in FIG. 10 includes a Random Access Memory (RAM) 1014, Read Only Memory (ROM) 1016, and an I/O adapter 1018. According to some embodiments, which are in no way intended to limit the invention, I/O adapter 1018 may include any of the approaches described above with reference to I/O adapter 218 of FIG. 2. Referring still to processor system 1000 of FIG. 10, the aforementioned components 1014, 1016, 1018 may be used for connecting peripheral devices such as storage subsystem 1020 to the bus 1012. In some embodiments, storage subsystem 1020 may include a similar and/or the same configuration as data storage system 220 of FIG. 2. According to an example, which is in no way intended to limit the invention, storage subsystem 1020 may include non-volatile data storage cards, e.g., having NVRAM memory cards, RAM, ROM, and/or some other known type of non-volatile memory, in addition to RAID controllers as illustrated in FIG. 2.

With continued reference to FIG. 10, a user interface adapter 1022 for connecting a keyboard 1024, a mouse 1026, a speaker 1028, a microphone 1032, and/or other user interface devices such as a touch screen, a digital camera (not shown), etc., to the bus 1012.

Processor system 1000 further includes a communication adapter 1034 which connects the processor system 1000 to a communication network 1035 (e.g., a data processing network) and a display adapter 1036 which connects the bus 1012 to a display device 1038.

The processor system 1000 may have resident thereon an operating system such as the MICROSOFT WINDOWS Operating System (OS), a MAC OS, a UNIX OS, etc. It will be appreciated that a preferred embodiment may also be implemented on platforms and operating systems other than those mentioned. A preferred embodiment may be written using JAVA, XML, C, and/or C++ language, or other programming languages, along with an object oriented programming methodology. Object oriented programming (OOP), which has become increasingly used to develop complex applications, may be used.

Figure 11:
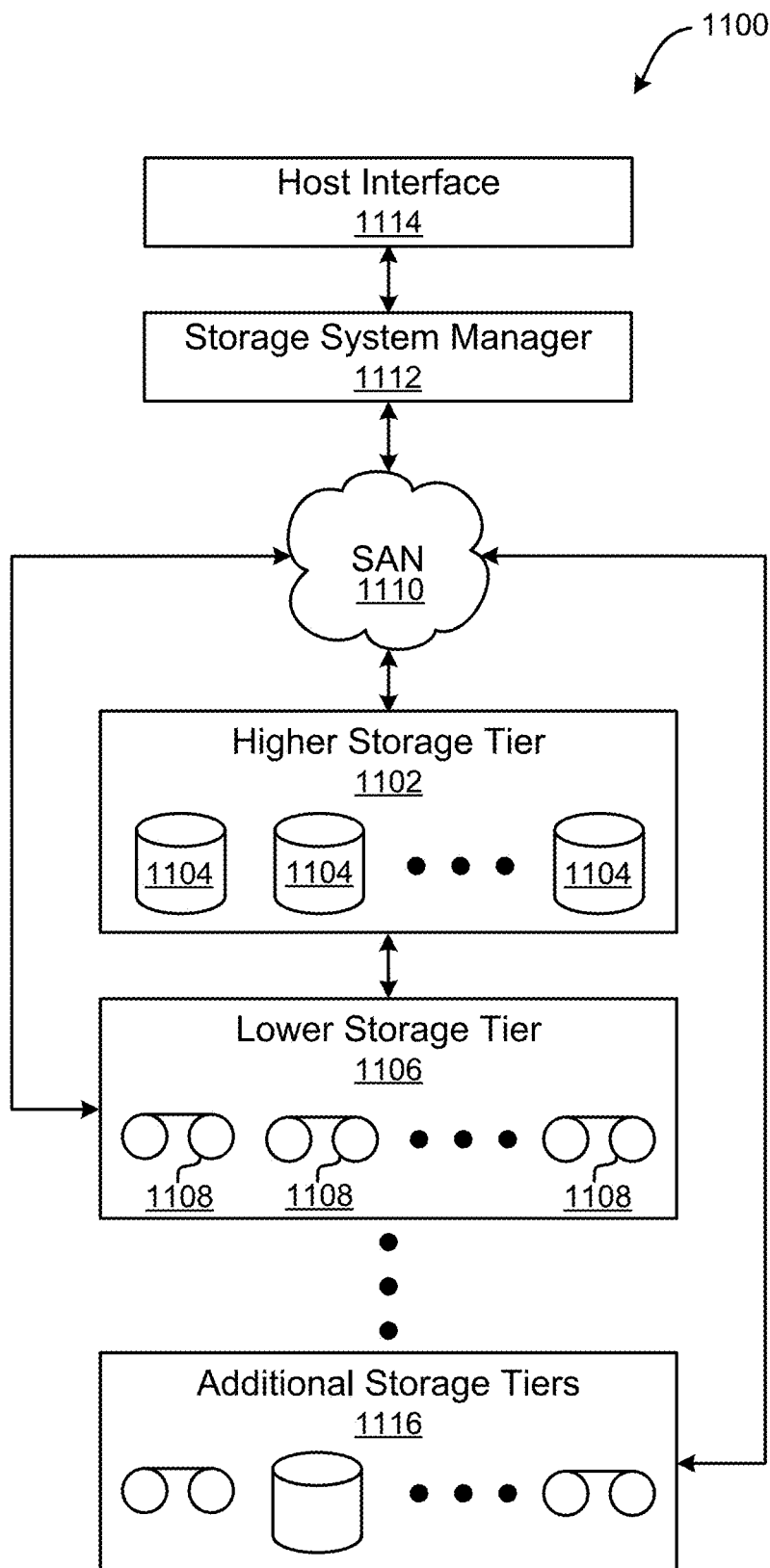
FIG. 11 is a tiered data storage system in accordance with one embodiment.

Moreover, FIG. 11 illustrates a storage system 1100 which implements high level (e.g., SSD) storage tiers in combination with lower level (e.g., magnetic tape) storage tiers, according to one embodiment. Note that some of the elements shown in FIG. 11 may be implemented as hardware and/or software, according to various embodiments. The storage system 1100 may include a storage system manager 1112 for communicating with a plurality of media on at least one higher storage tier 1102 and at least one lower storage tier 1106. However, in other approaches, a storage system manager 1112 may communicate with a plurality of media on at least one higher storage tier 1102, but no lower storage tier. The higher storage tier(s) 1102 preferably may include one or more random access and/or direct access media 1104, such as hard disks, nonvolatile memory (NVM), NVRAM), solid state memory in SSDs, Flash memory, SSD arrays, Flash memory arrays, etc., and/or others noted herein or known in the art. According to illustrative examples, FIGS. 3-4 show exemplary architectures of SSD systems which may be used as a higher storage tier 1102 depending on the desired embodiment.

Referring still to FIG. 11, the lower storage tier(s) 1106 preferably includes one or more lower performing storage media 1108, including sequential access media such as magnetic tape in tape drives and/or optical media, slower accessing HDDs, slower accessing SSDs, etc., and/or others noted herein or known in the art. One or more additional storage tiers 1116 may include any combination of storage memory media as desired by a designer of the system 1100. Thus, the one or more additional storage tiers 1116 may, in some approaches, include a SSD system architecture similar or the same as those illustrated in FIGS. 1-2. Also, any of the higher storage tiers 1102 and/or the lower storage tiers 1106 may include any combination of storage devices and/or storage media.

The storage system manager 1112 may communicate with the storage media 1104, 1108 on the higher storage tier(s) 1102 and lower storage tier(s) 1106 through a network 1110, such as a storage area network (SAN), as shown in FIG. 11, or some other suitable network type. The storage system manager 1112 may also communicate with one or more host systems (not shown) through a host interface 1114, which may or may not be a part of the storage system manager 1112. The storage system manager 1112 and/or any other component of the storage system 1100 may be implemented in hardware and/or software, and may make use of a processor (not shown) for executing commands of a type known in the art, such as a central processing unit (CPU), a field programmable gate array (FPGA), an application specific integrated circuit (ASIC), etc. Of course, any arrangement of a storage system may be used, as will be apparent to those of skill in the art upon reading the present description.

In more embodiments, the storage system 1100 may include any number of data storage tiers, and may include the same or different storage memory media within each storage tier. For example, each data storage tier may include the same type of storage memory media, such as HDDs, SSDs, sequential access media (tape in tape drives, optical disk in optical disk drives, etc.), direct access media (CD-ROM, DVD-ROM, etc.), or any combination of media storage types. In one such configuration, a higher storage tier 1102, may include a majority of SSD storage media for storing data in a higher performing storage environment, and remaining storage tiers, including lower storage tier 1106 and additional storage tiers 1116 may include any combination of SSDs, HDDs, tape drives, etc., for storing data in a lower performing storage environment. In this way, more frequently accessed data, data having a higher priority, data needing to be accessed more quickly, etc., may be stored to the higher storage tier 1102, while data not having one of these attributes may be stored to the additional storage tiers 1116, including lower storage tier 1106. Of course, one of skill in the art, upon reading the present descriptions, may devise many other combinations of storage media types to implement into different storage schemes, according to the embodiments presented herein.

According to some embodiments, the storage system (such as 1100) may include logic configured to receive a request to open a data set, logic configured to determine if the requested data set is stored to a lower storage tier 1106 of a tiered data storage system 1100 in multiple associated portions, logic configured to move each associated portion of the requested data set to a higher storage tier 1102 of the tiered data storage system 1100, and logic configured to assemble the requested data set on the higher storage tier 1102 of the tiered data storage system 1100 from the associated portions.

Of course, this logic may be implemented as a method on any device and/or system or as a computer program product, according to various embodiments.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method for calibrating read voltages for a block of memory, comprising:
    determining a current operating state of a block of memory, wherein the block includes more than one type of page therein, wherein at least one read voltage is associated with each of the page types;
    using the current operating state of the block to produce a hybrid calibration scheme for the block, wherein the hybrid calibration scheme identifies a first subset of the read voltages, as well as a second subset of the read voltages, wherein the read voltages in the second subset are organized in one or more groupings;
    calculating a unique read voltage offset value for each of the read voltages in the first subset;
    calculating a common read voltage offset value for each grouping of read voltages in the second subset;
    saving each of the unique read voltage offset values and each of the common read voltage offset values in a metadata storage area of the given block; and
    saving the hybrid calibration scheme in the metadata storage area of the given block.

2. The computer-implemented method of claim 1, wherein the current operating state of a block of memory is selected from the group consisting of: a retention state, a read-disturb state, and a cycling state.

3. The computer-implemented method of claim 1, wherein using the current operating state of the block to produce a hybrid calibration scheme for the block includes:
    matching the current operating state with a corresponding one of a number of predetermined calibration schemes for the block.

4. The computer-implemented method of claim 1, wherein using the current operating state of the block to produce a hybrid calibration scheme for the block includes:
    computing the hybrid calibration scheme for the block using statistics associated with the current operating state of the block.

5. The computer-implemented method of claim 4, wherein the statistics associated with the current operating state of the block are selected from the group consisting of: a program/erase counter, a read disturb counter, and a retention timer.

6. The computer-implemented method of claim 1, wherein each of the read voltages organized in a given grouping corresponds to a same page type.

7. The computer-implemented method of claim 1, wherein the memory includes three-dimensional triple-level-cell NAND Flash.

8. The computer-implemented method of claim 1, wherein the memory includes three-dimensional quad-level-cell NAND Flash.

9. A computer program product for calibrating read voltages for a block of memory, the computer program product comprising a computer readable storage medium having program instructions embodied therewith, the program instructions readable and/or executable by a processor to cause the processor to:
    determine, by the processor, a current operating state of a block of memory, wherein the block includes more than one type of page therein, wherein at least one read voltage is associated with each of the page types;
    use, by the processor, the current operating state of the block to produce a hybrid calibration scheme for the block, wherein the hybrid calibration scheme identifies a first subset of the read voltages, as well as a second subset of the read voltages, wherein the read voltages in the second subset are organized in one or more groupings;
    calculate, by the processor, a unique read voltage offset value for each of the read voltages in the first subset;
    calculate, by the processor, a common read voltage offset value for each grouping of read voltages in the second subset;
    save, by the processor, each of the unique read voltage offset values and each of the common read voltage offset values in a metadata storage area of the given block; and
    save, by the processor, the hybrid calibration scheme in the metadata storage area of the given block.

10. The computer program product of claim 9, wherein the current operating state of a block of memory is selected from the group consisting of: a retention state, a read-disturb state, and a cycling state.

11. The computer program product of claim 9, wherein using the current operating state of the block to produce a hybrid calibration scheme for the block includes:

matching the current operating state with a corresponding one of a number of predetermined calibration schemes for the block.

12. The computer program product of claim 9, wherein using the current operating state of the block to produce a hybrid calibration scheme for the block includes:
computing the hybrid calibration scheme for the block using statistics associated with the current operating state of the block.

13. The computer program product of claim 12, wherein the statistics associated with the current operating state of the block are selected from the group consisting of: a program/erase counter, a read disturb counter, and a retention timer.

14. The computer program product of claim 9, wherein each of the read voltages organized in a given grouping correspond to a same page type.

15. The computer program product of claim 9, wherein the memory includes three-dimensional triple-level-cell NAND Flash.

16. The computer program product of claim 9, wherein the memory includes three-dimensional quad-level-cell NAND Flash.

17. A system, comprising:
a processor; and
logic integrated with and/or executable by the processor, the logic being configured to:
determine, by the processor, a current operating state of a block of memory, wherein the block includes more than one type of page therein, wherein at least one read voltage is associated with each of the page types;
use, by the processor, the current operating state of the block to produce a hybrid calibration scheme for the block, wherein the hybrid calibration scheme identifies a first subset of the read voltages in the block, as well as a second subset of the read voltages in the block, wherein the read voltages in the second subset are organized in one or more groupings;
calculate, by the processor, a unique read voltage offset value for each of the read voltages in the first subset;
calculate, by the processor, a common read voltage offset value for each grouping of read voltages in the second subset;
save, by the processor, each of the unique read voltage offset values and each of the common read voltage offset values in a metadata storage area of the given block; and
save, by the processor, the hybrid calibration scheme in the metadata storage area of the given block.

18. The system of claim 17, wherein the current operating state of a block of memory is selected from the group consisting of: a retention state, a read-disturb state, and a cycling state.

19. The system of claim 17, wherein using the current operating state of the block to produce a hybrid calibration scheme for the block includes:
matching the current operating state with a corresponding one of a number of predetermined calibration schemes for the block,
wherein each of the read voltages organized in a given grouping correspond to a same page type.

20. The system of claim 17, wherein using the current operating state of the block to produce a hybrid calibration scheme for the block includes:
computing the hybrid calibration scheme for the block using statistics associated with the current operating state of the block,
wherein the statistics associated with the current operating state of the block are selected from the group consisting of: a program/erase counter, a read disturb counter, and a retention timer.

* * * * *